US007738618B2

(12) United States Patent
Jacobsson et al.

(10) Patent No.: US 7,738,618 B2
(45) Date of Patent: Jun. 15, 2010

(54) MULTIBAND PLL ARRANGEMENT AND A METHOD OF CONTROLLING SUCH ARRANGEMENT

(75) Inventors: Harald Jacobsson, Västra Frölunda (SE); Emanuele Lopelli, Bari (IT)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 445 days.

(21) Appl. No.: 10/595,426

(22) PCT Filed: Oct. 23, 2003

(86) PCT No.: PCT/SE03/01641

§ 371 (c)(1),
(2), (4) Date: Jan. 16, 2008

(87) PCT Pub. No.: WO2005/041415

PCT Pub. Date: May 6, 2005

(65) Prior Publication Data

US 2009/0141825 A1    Jun. 4, 2009

(51) Int. Cl.
*H03D 3/24* (2006.01)
(52) U.S. Cl. .......... 375/375; 375/294; 375/355; 375/371; 375/373; 375/374; 375/376
(58) Field of Classification Search .......... 375/294, 375/376, 371, 375
See application file for complete search history.

(56) References Cited

U.S. PATENT DOCUMENTS

| | | | |
|---|---|---|---|
| 5,497,127 A | 3/1996 | Sauer | |
| 6,396,890 B1* | 5/2002 | Turner | 375/376 |
| 6,469,584 B1 | 10/2002 | Eker et al. | |
| 6,664,826 B1* | 12/2003 | Creed et al. | 327/147 |
| 6,778,024 B2* | 8/2004 | Gupta et al. | 331/16 |
| 6,806,786 B1* | 10/2004 | Lam et al. | 331/179 |
| 7,129,792 B2* | 10/2006 | Gomez | 331/16 |
| 2002/0089383 A1* | 7/2002 | Su et al. | 331/17 |
| 2002/0175769 A1 | 11/2002 | Wong et al. | |
| 2003/0050029 A1* | 3/2003 | Kaufmann et al. | 455/260 |

FOREIGN PATENT DOCUMENTS

WO    2004004126 A1    1/2004

OTHER PUBLICATIONS

Palermo et al., "A Multi-Band Single-Loop PLL Frequency Synthesizer with Dynamically-Controlled Switched Tuning VCO", Proc. 43rd IEEE Midwest Symp. On Circuits and Systems, Lansing, MI, Aug. 2000, pp. 818-821.
Wilson, W.B. et al., "A CMOS Self-Calibrating Frequency Synthesizer", IEEE Journal of Solid-State Circuits, vol. 35, No. 10, Oct. 2000, pp. 1437-1444.
Lin, Tsung-Hsien et al., "A 900-MHz 2.5-mA CMOS Frequency Synthesizer with an Automatic SC Tuning Loop", IEEE Journal of Solid-State Circuits, vol. 36, No. 3, Mar. 2001, pp. 424-431.
PCT International Search Report, mailed May 19, 2004, in connection with International Application No. PCT/SE2003/001641.
PCT International Preliminary Report on Patentability, mailed Oct. 28, 2005, in connection with International Application No. PCT/SE2003/001641.

* cited by examiner

*Primary Examiner*—Shuwang Liu
*Assistant Examiner*—Dhaval Patel
(74) *Attorney, Agent, or Firm*—Potomac Patent Group PLLC

(57) ABSTRACT

The present invention relates to a multiband PLL arrangement comprising a single loop PLL with a phase/frequency detecting means (1), a loop filter means (2) and a Voltage Controlled Oscillator (VCO) (3), to which PLL a reference voltage signal ($V_{ref}$) is input. It further comprises a control circuit for appropriately locking the VCO (3) to the correct frequency band, said control circuit comprising a multi-window circuit (4) with at least first and second window amplitudes each defined by respective upper and lower voltage levels, and comparing means (5A, 5B) are provided for comparing a first VCO control voltage output from the loop filter means (2) with the upper and lower voltage levels of a first, broadest amplitude window. If the VCO control voltage settles within said first amplitude window, a narrower window is selected, the voltage levels of which are compared with the VCO control voltage and if the VCO control voltage settles within that or a further subsequent, smaller amplitude window, phase lock is achieved, otherwise, if the VCO control voltage does not settle within said windows, this is established by the comparing means (5A, 5B), said comparing means (5A, 5B) providing a signal for providing a second control signal to the VCO (3) for switching it to another, higher or lower, frequency band. For said other frequency band, the resulting first VCO control voltage signal is compared with said first amplitude window etc. until phase lock is achieved in the appropriate frequency band.

27 Claims, 12 Drawing Sheets

US 7,738,618 B2

MULTIBAND PLL ARRANGEMENT AND A METHOD OF CONTROLLING SUCH ARRANGEMENT

This application is a U.S. national stage application of International Application No. PCT/SE2003/001641 filed Oct. 23, 2003.

FIELD OF THE INVENTION

The present invention relates to a multiband PLL (Phase Locked Loop) arrangement comprising a single loop PLL with phase/frequency detecting means, loop filter means and a Voltage Controlled Oscillator. The invention also relates to a method of controlling such a multiband VCO arrangement e.g. such that the VCO locks appropriately in the correct frequency band.

STATE OF THE ART

In the society of today wireless communications have developed exceedingly fast and it has been a technical revolution all over the world for communication systems operating at different frequencies for different wireless standards, e.g. from 900 MHz up to 40 GHz, the GHz range being relevant for microwave links. Such microwave links are getting more and more used within mobile telephony systems and for broadband data communication. All these systems need a lot of hardware and they operate over a wide frequency range. It would therefore be convenient if the same or similar hardware could be used for different kinds of systems and for systems operating at different frequencies. There is a general intention and desire to reduce the size of the components used in such systems, and it is of course also desired to be able to reduce the fabrication costs for involved components as well as the power consumption in general.

The transceiver is the interface between the user and the transition medium (free air for wireless communication systems)

A most important and critical element of a transceiver is the frequency synthesizer which is a circuit generating a very precise, temperature stable frequency according to an input external frequency reference. Most of the time this frequency also must have a constant phase difference with respect to the reference signal. So called multi-standard frequency synthesizers need to be able to synthesize different bands of frequencies for different wireless standards. A multiband frequency synthesizer has to be able to synthesize a wide range of frequencies while still satisfying strict phase noise specifications. A multiband frequency synthesizer is used to synthesize multiple frequency bands, and there is a need for such a synthesizer which is cheap and easy to fabricate and which preferably is highly integrated. This is however complicated to achieve, for example due to the fact that the low pass filter used normally has to be external because of the noise requirement.

Generally there are three different types of frequency synthesizers, namely the table-look-up synthesizer, the direct synthesizer and the indirect or phase locked synthesizer. Most frequency synthesizers used within mobile communications are of the phase locked loop type. In such frequency synthesizers the reference frequency, which generally is a low frequency, is multiplied by a variable integer (or fractional) number. This is cone by dividing the output frequency for that number and adjusting the output frequency so that the divided frequency will equal the input reference frequency. This means that the Voltage Controlled Oscillator (VCO) output frequency is divided by the variable factor N in the loop and compared with the reference frequency at the input of the phase detector, the output of which is a signal proportional to the phase difference between the two signals supplied at its input. The signal is then low-pass filtered by a loop filter and forms the control voltage being input to the VCO. At a lock condition, the two inputs to the phase detector have a constant phase relationship, and thus equal frequencies. The output frequency therefore will be N×the reference frequency. If the output frequency increases, the phase difference between the two inputs to the phase detector will change in order to decrease the output from the phase detector. This tunes the VCO to a lower frequency until the correct output frequency is reached again. The loop filter suppresses undesired components and reduces noise etc. This is however quite a slow procedure and changing the frequency is done by changing the divider modulus N which results in a slow change of the VCO control voltage until steady-state operation is obtained. Fast frequency changes are possible only if the loop bandwidth is large, which however means that more noise can pass through the filter which is disadvantageous.

In order to obtain a wide tuning range, it has been realized that a multiband VCO can be used allowing a wide tuning range and a small VCO conversion gain, which makes a phase locked loop with the switched tuning voltage VCO appropriate. However, so far it has not been possible to appropriately design the switch control circuit to be able to lock the switched tuning VCO in the appropriate operational band such that it can be used under general, or different conditions, such as for narrow bandwidth applications, particularly not allowing use of the most linear part of the tuning curve.

In a multiband frequency synthesizer a single wide-range tuning curve has to be broken into several sections of a narrower range with some frequency overlap. This is generally accomplished by employing both discrete and continuous tuning and there are different approaches to the design of a calibration circuit. In particular self-calibrating methods are desirable to implement.

In "A 900-MHz 2.5-mA CMOS Frequency Synthesizer with an Automatic SC Tuning Loop", IEEE Journal of Solid-State Circuits, Vol. 36, No. 3, March 2001, pp. 424-431, by Tsung-Hsien Lin and W. J. Kaiser, a dual loop PLL frequency synthesizer is disclosed. It discloses a coarse tuning loop which first searches for the proper frequency curve. When this has been found, the CMOS varactor in the VCO is tuned to synthesize the desired channel in the main loop. The loop operates only during the calibration process, during which the PLL is supposed to be out of lock. When the calibration process has been completed, only the main loop will operate and therefore the main loop has to be designed such as to meet all the specifications for the frequency synthesizer. A serious disadvantage of such a construction is that the hardware required is doubled, i.e. two complete PLLs have to been used which in turn means that the device gets large and it requires a high power consumption. Therefore it is among others disadvantageous as far as the object to provide a small size arrangement is concerned. It is also not capable to use the most linear part of the tuning curves.

In "A CMOS Self-Calibrating Frequency Synthesizer", IEEE Journal of Solid-State Circuits, Vol. 35, No. 10, October 2000, pp. 1437-1444 by W. B. Wilson, Un-Ku Moon, K. R. Lakshimikumar, Liang Dai, an all digital calibration loop is used. It is an disadvantage of this construction that it requires a lot of digital blocks and it has a high complexity and it is not capable to use the most linear part of the tuning curves.

Still further attempts have been done to provide a frequency synthesizer with a self calibrating circuit comprising a switch controlling circuit. Such an arrangement is disclosed FIG. 1 in which a reference voltage $V_{ref}$ is input to a phase detector $1_0$ filtered in a low pass filter to provide a voltage $V_c$ input to switch control $4_0$ which forms the VCO control voltage, which is an analog signal. The output from the switch control controls the switching of the VCO between bands. Thus a signal of the PLL loop is used to control the VCO instead of a complete loop, which is advantageous. However, it is a problem that the circuit can not be designed without taking into account the complete PLL and all the specifications of the frequency synthesizer, which makes the design of the control circuit adapted to the frequency synthesizer and therefore it might have to be modified if the specifications of the PLL change. This means that there are no problems if the bandwidth is increased, but that the problems are considerable if the bandwidth is reduced. This means that the zero in the loop filter has to be moved to a lower frequency which means that the overshoot problem will increase which is a serious problem in the design of such control systems.

A PLL will have a characteristic overshoot when acquiring lock condition, which particularly constitutes a problem when a digital calibration loop is used. Attempting to synthesize an edge of the band frequency may produce oscillations between different bands since the overshoot will cause the PLL to jump to the adjacent higher or lower frequency band which however cannot synthesize the desired frequency. Then the PLL will return to the previous band. Then, however, again the overshoot will push it out of the band as described above, and the system will thus oscillate between adjacent frequency bands.

Another problem is due to the ripple in the VCO control voltage, and comparators used in a switching control system to compare the VCO control voltage for the high and the low reference value to detect whether the VCO control voltage needs to be increased or decreased, might have to be substituted through hysteresis comparators to avoid unwanted switching due to ripple. If hysteresis comparators are used, unwanted switching of a comparator will not occur due to ripple and the VCO will increase the voltage until it reaches a threshold level and then the comparator is able to switch. However, then the frequency will be too low, meaning that the voltage will start to decrease, but due to the overshoot, the VCO control voltage will reach the other threshold level of the comparator and the system will switch again to the first band and this procedure will continue indefinitely.

In "A Multi-Band Single-Loop PLL Frequency Synthesizer with Dynamically-Controlled Switched Tuning VCO", Proc. 43$^{rd}$ IEEE Midwest Symp. On Circuits and Systems, Lansing Mich., August 2000, pp. 818-821, by Palermo et al., an attempt to solve this problem is disclosed by providing a frequency overlap for a continuous frequency system. In such a continuous frequency system the frequency overlap consists of a spectrum that is shared by adjacent channels. Such a solution is acceptable if the required frequency overlap is not more than 35%, otherwise the range of frequencies that the system is able to synthesize will be considerably decreased. This means that the size of the overshoot has to be known for the particular PLL in concern. This is disadvantageous and the overlapping approaches often are not applicable, for narrow bandwidth applications in particular.

The solution suggested in the above mentioned document is not capable to provide for correct operation in a narrow bandwidth PLL and it is dependent on the use of a passive filter and a dual supply voltage, which is disadvantageous.

A particular problem associated with the latter solution is further that the switch simply is connected to ground since the mid-level of the VCO control voltage is zero volt. This is possible since a dual power supply (+/−2.5V) is used.

As can be seen, none of the suggested solutions disclose an arrangement which is capable to use the most linear part of the tuning curves for a narrow bandwidth (and preferably also for a large bandwidth), and at the same is capable to provide a linear narrow bandwidth PLL, which is non-complex and easy and cheap to fabricate as well as capable of guaranteeing loop stability.

SUMMARY OF THE INVENTION

What is needed is therefore a PLL arrangement as initially referred to through which different frequency bands can be synthesized for different standards while satisfying strict phase noise specifications, like in microwave minilink. An arrangement is also needed through which the band of operation can be correctly selected while still keeping the VCO control voltage in a small voltage range in order to increase the frequency versus voltage linearity of the VCO. Particularly it is an object to provide an arrangement satisfying the above mentioned requirements for a PLL frequency synthesizer having a narrow bandwidth, e.g. 50 Hz. Particularly an arrangement is needed through which it is possible to restart the locking process every time lock is lost in a simple manner without, to the largest possible extent, the use of external components, and preferably to be able to detect when locking has been accomplished.

Particularly it is an object to provide an arrangement that assures correct operation also when the bandwidth is narrow and which can handle the problems concerning overshoot (and ripple) as referred to above. Particularly it is an object to provide an arrangement which is cheap and easy to fabricate and which is not particularly complex. A particular object is to provide an arrangement which allows for detection of a lock condition. Still further a particular object is to provide an arrangement which at the same time allows the use of an active, particularly external or internal, filter as a loop filter as well as it is a particular object to allow the use of a single supply voltage instead of a dual power supply.

Particularly it is an object to provide an arrangement through which a lock condition can be accomplished in a fast and safe manner.

A PLL arrangement which is fast, easy and cheap to fabricate, and which is reliable is moreover needed which can be used for modulation/demodulation purposes, for clock recovery, for carrier regeneration and for skew compensation.

Moreover a method of controlling a multi-band PLL as referred to above is needed through which one or more of the objects referred to above can be fulfilled. Particularly a method of controlling a multiband frequency synthesizer, i.e. a PLL used for frequency synthesizing purposes, is needed.

Therefore an arrangement as initially referred to is provided which comprises a control circuit for appropriately locking the VCO to the correct frequency band, which comprises a multi-window circuit with at least first and second window amplitudes, each defined by respective upper and lower voltage levels. The arrangement further comprises comparing means for comparing a first analog VCO control voltage with the upper and lower voltage levels of a first (large) amplitude, window, such that if the VCO control voltage falls and settles within said first amplitude window, a smaller amplitude window is selected and the voltage levels of that second, smaller window, are compared with the VCO control voltage. If the VCO control voltage settles within that subsequent smaller amplitude window, lock has been achieved, whereas if the VCO control voltage does not settle within the first, largest or either of said windows, this is established by the comparing means, which provide a signal to switching enabling means, thus providing a second control signal to the VCO for switching it to another, higher or lower, frequency band. The procedure is repeated, a first, large amplitude window is selected, the resulting first VCO control voltage signal is compared with said amplitude window etc. until phase lock is achieved in the appropriate frequency band.

Particularly the first VCO control voltage signal comprises an analog signal.

Particularly the second VCO control voltage signal is a digital signal (providing for switching).

The comparing means particularly comprises a first and a second comparator for comparing the first VCO control voltage with the upper voltage level and the lower voltage level respectively of the amplitude windows, whereas if the first VCO control voltage exceeds the upper voltage level or falls below the lower voltage level, an appropriate signal is provided to the switching enabling means to indicate whether a switch is to be done to a higher or to a lower frequency band.

The comparing means are particularly connected to first delay means, a counter being provided such that if a switching is required to another frequency band, the appropriate signal is provided to the switching enabling means after lapse of a given delay time period in order to assure that switching is not performed to soon. The switching enabling means particularly comprises a state machine which upon reception of a clocked signal from the comparing means provides the second control signal to the VCO, enabling a shift of frequency band. In a most preferable implementation, an arbitrary operation amplitude window can be selected once a locking condition has been accomplished, among the windows available in the multi-window circuit in order not to use an amplitude window that is unnecessarily narrow. Of course it is possible to remain with the narrowest window, but it is also possible to increase the window size or even to use the largest window.

The control circuit preferably comprises a lock detection circuit for continuously monitoring whether the VCO has been locked to the accurate frequency in the appropriate frequency band. This is however not necessary for the functioning of the present invention, but merely relates to a most advantageous implementation. Particularly the lock detection circuit is capable of restarting the locking procedure every time that the VCO control voltage falls outside the voltage levels of an amplitude window. This means that the lock detection circuit comprises means for initiating restart of the locking procedure if locking has failed or if lock is lost. Particularly the lock detection circuit compares signals from the comparators and from the multi-window circuit to establish if the first VCO control voltage settles within the relevant amplitude window or not (by the use of a counter), such that if the first VCO control voltage is outside the amplitude window, the locking procedure is restarted, otherwise a lock accomplished state is indicated.

In a particular implementation the arrangement comprises a loop switch arrangement comprising a threshold circuit for adjusting the VCO control voltage to make it assume a desired voltage within the relevant amplitude window. In one embodiment the desired voltage is the mid-level voltage. In other embodiments it is a voltage higher or lower than the mid-level voltage. The loop switch particularly comprises a threshold circuit controlling a switching arrangement comprising two transistors for, depending on whether an adjustment upwards or downwards is required, charging/discharging a VCO voltage control point (CP) until the VCO control voltage value substantially assumes the desired voltage within the amplitude window using the supply voltage. Particularly the threshold circuit uses input signals from the first and second comparators and the analog VCO control signal to establish whether an adjustment upwards or downwards of the analog VCO control voltage signal is needed. In a preferred embodiment the arrangement comprises a PLL frequency synthesizer with a phase/frequency detector, a loop filter and a VCO. Particularly the control point is located in the loop filter. Even more particularly the loop filter is an active filter, external or internal, comprising an amplifier and most advantageously the control point is located before the amplifier of the loop filter.

In another embodiment the arrangement comprises a PLL frequency synthesizer with a phase frequency detector and a charge pump. Then no separate active loop filter is used and the control point can be said to be the VCO control voltage, i.e. a (large) capacitor is charged/discharged to control the VCO control voltage.

According to the invention a single supply voltage is used and the PLL is a narrowband PLL.

The invention therefore also suggests a method for controlling a multiband arrangement comprising a single loop PLL with phase/frequency detecting means, a loop filter means and a voltage controlled oscillator, wherein a reference voltage signal ($V_{ref}$) is input to the arrangement, which method comprises the steps of; providing the reference voltage $V_{ref}$ signal to a PLL (external or integrated) comprising a phase/frequency detector e.g. followed by a loop filter means, and to a multi-window circuit; setting a first, large, amplitude window defined by an upper and a lower voltage level; establishing whether the first analog VCO control voltage output from the low-pass filter settles within the first, largest, amplitude window, if yes, changing the multi-window circuit to a smaller amplitude window at least once, while; establishing if the first VCO control voltage settles within the voltage amplitude interval, if not, using the result of the comparison to establish whether a switch to a higher or to a lower frequency band should be done; providing a digital control signal to the VCO to switch it to such higher or lower frequency band; repeating the procedure by first implementing a large amplitude window, followed by a smaller amplitude window etc. unless a further frequency band switch is required etc., until locking has been accomplished in the appropriate frequency band.

Preferably the method comprises the step of adjusting the VCO control voltage once it settles within an amplitude window to make it assume a desired voltage, e.g. the mid-level voltage, within the voltage amplitude window by means of a digital threshold circuit and a transistor arrangement, and using a single supply voltage. It should be clear that the desired voltage does not have to be the mid-level voltage, but that it may be a voltage closer to the upper or lower reference voltages.

Particularly the method comprises the step of providing a signal from the transistor arrangement to a control point (CP) in the loop filter, said loop filter being an external, active filter. Most preferably the control point is located before the loop filter amplifier otherwise the amplifier will counteract the controlling and making it much more difficult.

Alternatively the arrangement comprises a phase frequency detector and a charge pump. The method then comprises the step of directly controlling the VCO control voltage.

The method particularly comprises the step of resetting the VCO control voltage each time when there has been a switch in frequency band. Further the method particularly comprises the steps of; monitoring (continuously) whether a lock condition has been accomplished, and indicating when lock has been accomplished, or initiating a restart of the locking procedure if a switch of frequency band is needed, i.e. if the control voltage does not settle within an amplitude window (locking has not been accomplished).

It should be clear that the use of a lock detection circuit is not necessary for the functioning of the present invention but merely constitutes an advantageous embodiment, and that further it is also not necessary to adjust the voltage to a desired, e.g. midlevel voltage, which according to a preferred implementation is provided for by the use of a loop switch comprising a threshold circuit and a transistor arrangement.

BRIEF DESCRIPTION OF THE DRAWINGS

The invention will in the following be further described, in a non-limiting manner, and with reference to the accompanying drawings, in which.

DETAILED DESCRIPTION OF THE INVENTION

Figure 1:
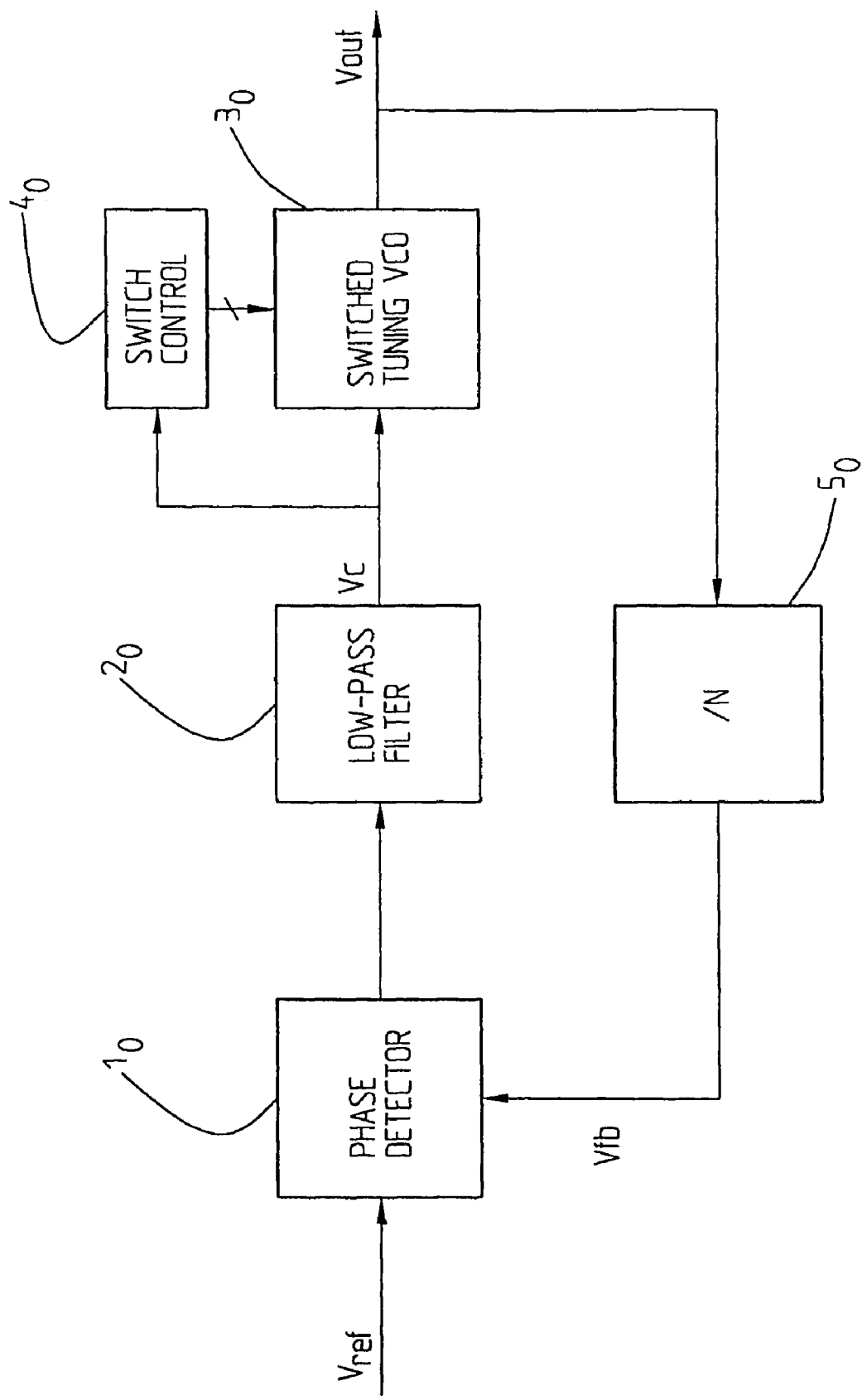
FIG. 1 is a block diagram of a frequency synthesizer arrangement with a self calibrating circuit including a switch controlling circuit.
Figure 2:
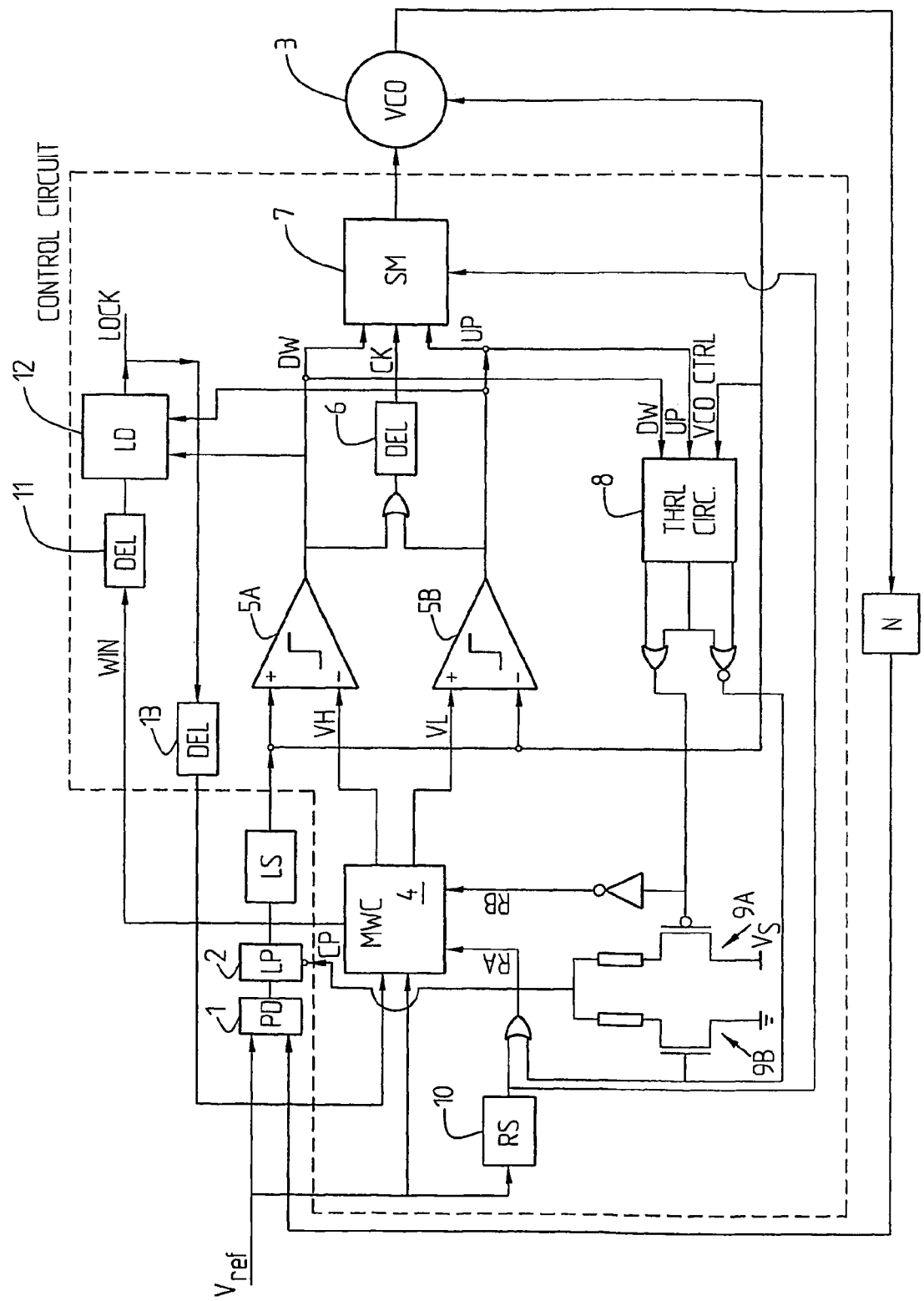
FIG. 2 is a block diagram of a frequency synthesizing arrangement with a control circuit according to a preferred implementation including lock detection and voltage adjustment functionalities.

FIG. 2 shows a PLL arrangement (e.g. for frequency synthesizing) according to an advantageous implementation of the present invention in which a reference voltage $V_{ref}$ is input to a phase detector 1 connected to a loop filter 2. The loop filter 2 advantageously comprises here an active, external or internal, filter as will be more thoroughly described with reference to FIG. 8. In the figure also a level shifter LS is indicated which the signal output from the low pass filter 2 has to pass. This is however not given any reference numeral since it is merely used for adapting an external circuit to the DC level of the control circuit in case it is an external PLL. It is here supposed that the phase detector PD 1, the loop filter LP 2, (a level shifter) and the VCO 3 may be external, the control circuit being indicated through a dashed line. (One or more of the components may also be integrated, i.e. they do not have to be external.)

In an alternative embodiment the arrangement may comprise a phase frequency detector and a charge pump comprising a low pass filter.

The reference voltage $V_{ref}$ is, in addition to being input to the phase detector, also input to a multi-window circuit MWC 4 and a reset circuit RS 10. Due to the provision of the multi-window circuit 4 the overshoot problem as discussed earlier in the application can be solved. In the multi-window circuit 4 a number of different amplitude windows are defined, each represented by an upper and a lower voltage level. The locking procedure is first started (after resetting a counter and selecting bit sequence (frequency band)) using a large window, and by means of a comparing arrangement comprising first comparing means 5A and second comparing means 5B the voltage levels of the amplitude window used are compared with the control voltage (after passing the filter 2) and it is established whether the control voltage settles within the window or not. If it does not, it can also be settled if it is higher than the highest voltage level or lower than the lowest voltage level. If the voltage settles within an amplitude window is advantageously determined by means of a counter which is set, and, if after lapse of a given time interval, the voltage signal has stabilized, it is considered to have settled within the amplitude window in question, otherwise not.

It is supposed that if the control voltage settles within the first (largest) window (within a predetermined time interval, a delay), a change is done to a smaller window and it is established whether the control voltage settles within that smaller window etc. until a phase lock condition is achieved, e.g. can be detected or established.

Figure 9:
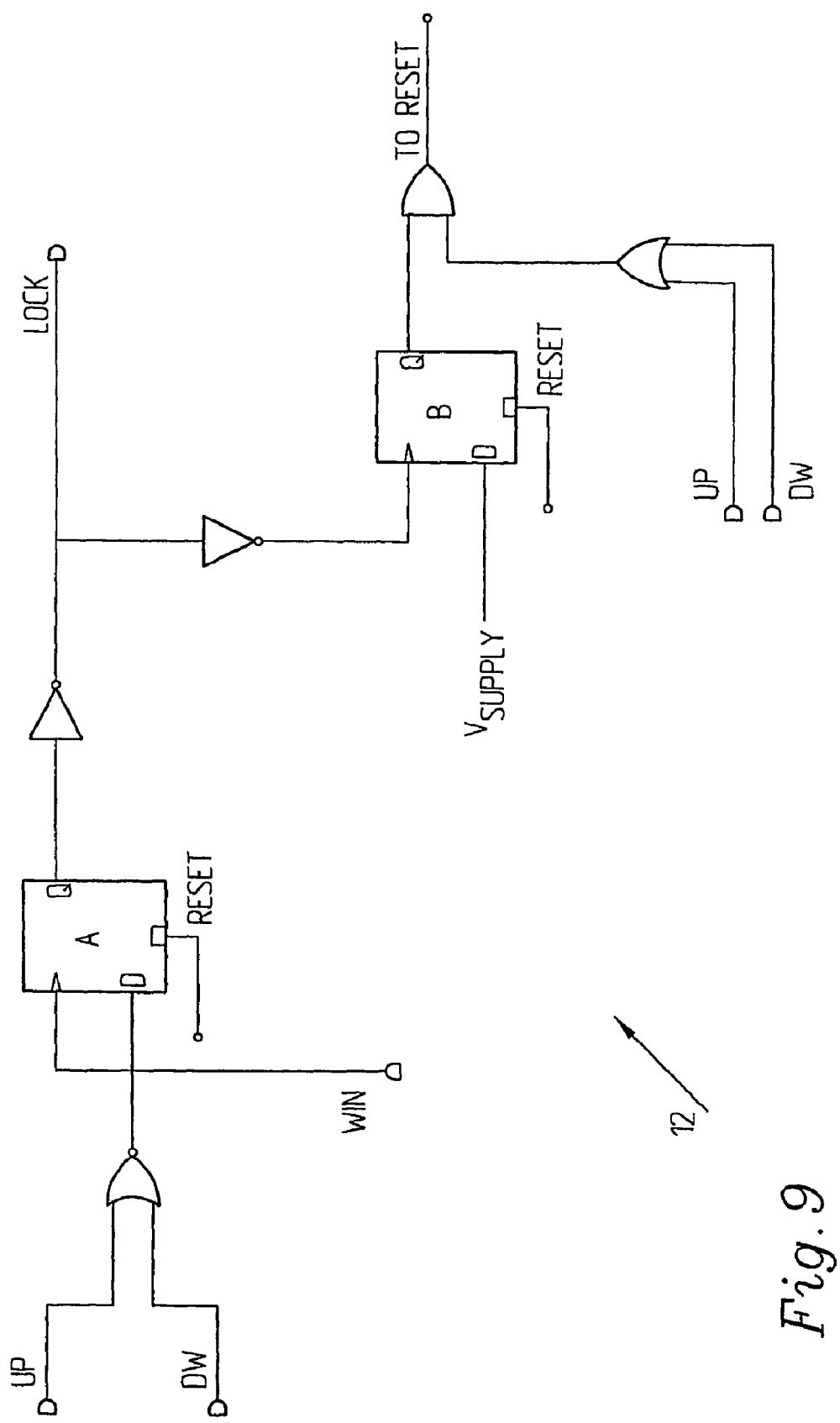
FIG. 9 shows a lock detection circuit.

In an advantageous implementation of the present invention this can be done by means of lock detection means 12, cf. FIG. 9, (which however are not necessary for the functioning of the present invention). To said lock detection means 12 a signal is input indicating which is the window, e.g. indicating if it is the smallest window (lock achieved). In one implementation it is a WIN signal from MWC 4 which goes high if it is the smallest window, otherwise it is low. The logic for establishing which is the window may be provided for in MWC 4 or in LD 12. To LD 12 is input as well the result of the comparison in the comparing means 5A, 5B (UP, DW). A delay is introduced by delay means 11 to assure that there is enough time for the signal to settle. When phase lock has been achieved, a delayed signal (delay means 13) is returned to the multi-window circuit 4 for the subsequent phase lock procedure. The lock detection circuit 12 continuously monitors the lock condition of the frequency synthesizer. The lock detection circuit is able to restart the locking procedure every time the VCO control voltage exceeds a fixed amplitude window. A lock detection circuit 12 will be further described with reference to FIG. 9 and the procedure when lock is accomplished is illustrated with reference to the diagram in FIG. 10.

Delay means 6 is needed to give the comparators time to, if necessary, perform a full transition from low to high logic level. The delay means 11 introduces a delay for the WIN signal, which is necessary for the lock detection circuit to operate properly. Delay means 13 are necessary, since if the system is locked, the window (e.g. [1.5;1.9] V must be given some time; otherwise the lock detection circuit might produce a lock signal even if locking is not done in the adequate window.

After reset circuit 10 an OR gate is provided to reset the counter in the multi-window circuit 4 at power up and switch of frequency band.

After the comparison in the comparing means 5A, 5B a delay is required which is provided by first delay means 6. If the signal is stabilized within the set first amplitude interval, after a time period set in a counter has lapsed (in the multi-window circuit), a narrower amplitude window is selected etc. as referred to above. If however the voltage is higher than the upper level (comparator 5A) or lower than the lower level (comparator 5B), by means of the first delay means 6 the relevant up UP or down DW signal is clocked CK into the state machine SM 7, i.e. a digital signal is provided and the state machine 7 provides for a switch in frequency band, up or down depending on whether the up (UP) or down (DW) signal was clocked (CK) into the state machine 7 and it thus constitutes a digital control signal to the VCO 3 which makes it switch to a higher or lower frequency band. Then the procedure is restarted after reset of a counter and it is again started with the largest amplitude window etc. as described above. The locking procedure is repeated for as many frequency bands as needed until lock actually is achieved. Between each switch of frequency bands, a counter is reset, and set to count when a large window is selected etc.

Figure 5:
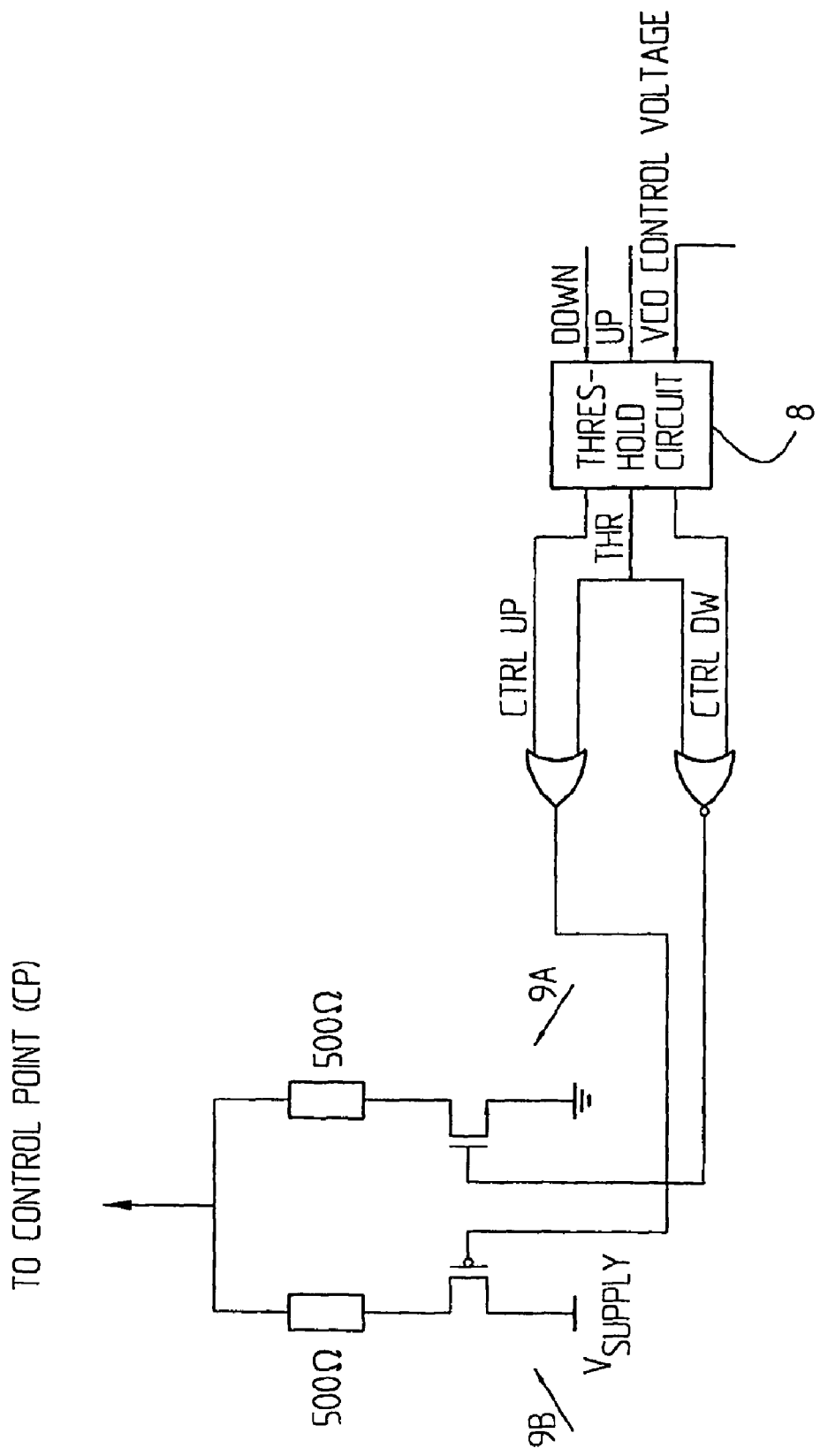
FIG. 5 illustrates one example of a loop switch including a threshold circuit and a transistor arrangement according to one implementation of the invention.

In FIG. 5 an advantageous implementation is indicated in which a loop switch with a threshold circuit THR 8 and a transistor arrangement 9B, 9A are provided. Through the use of the threshold circuit 8 to which the up UP and down DW signals are provided as well as the VCO control voltage, it can be determined whether the voltage is to be increased or decreased in order to make the VCO control voltage assume the desired voltage, e.g. to ensure the stability of the circuit. Depending on whether the voltage should be increased or decreased, the threshold circuit 8 controls the switches made up from, here, an N-MOS and a P-MOS transistor, for charging/discharging a control point CP in the loop filter 2. When THR goes high, the controlling or adjustment up or down is interrupted. The loop filter is further discussed in FIG. 8 as well as the location of the control point CP e.g. before the amplifier of an active loop filter 2, if such is used.

Alternatively the arrangement comprises a phase frequency detector with a charge pump which comprises the loop filter functionality (then it is a passive filter).

Figure 6:
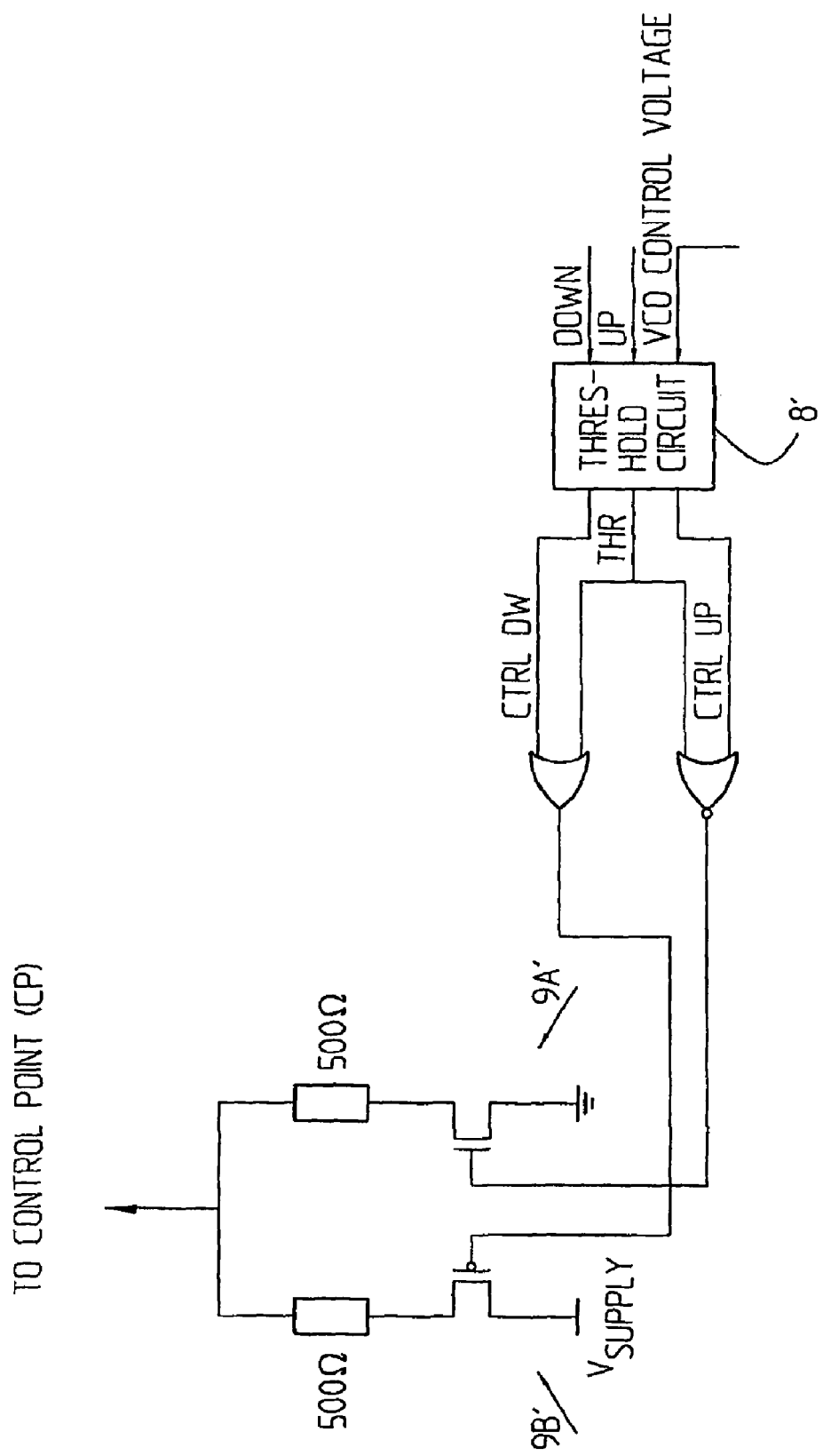
FIG. 6 shows an alternative implementation of a loop switch.
Figure 7:
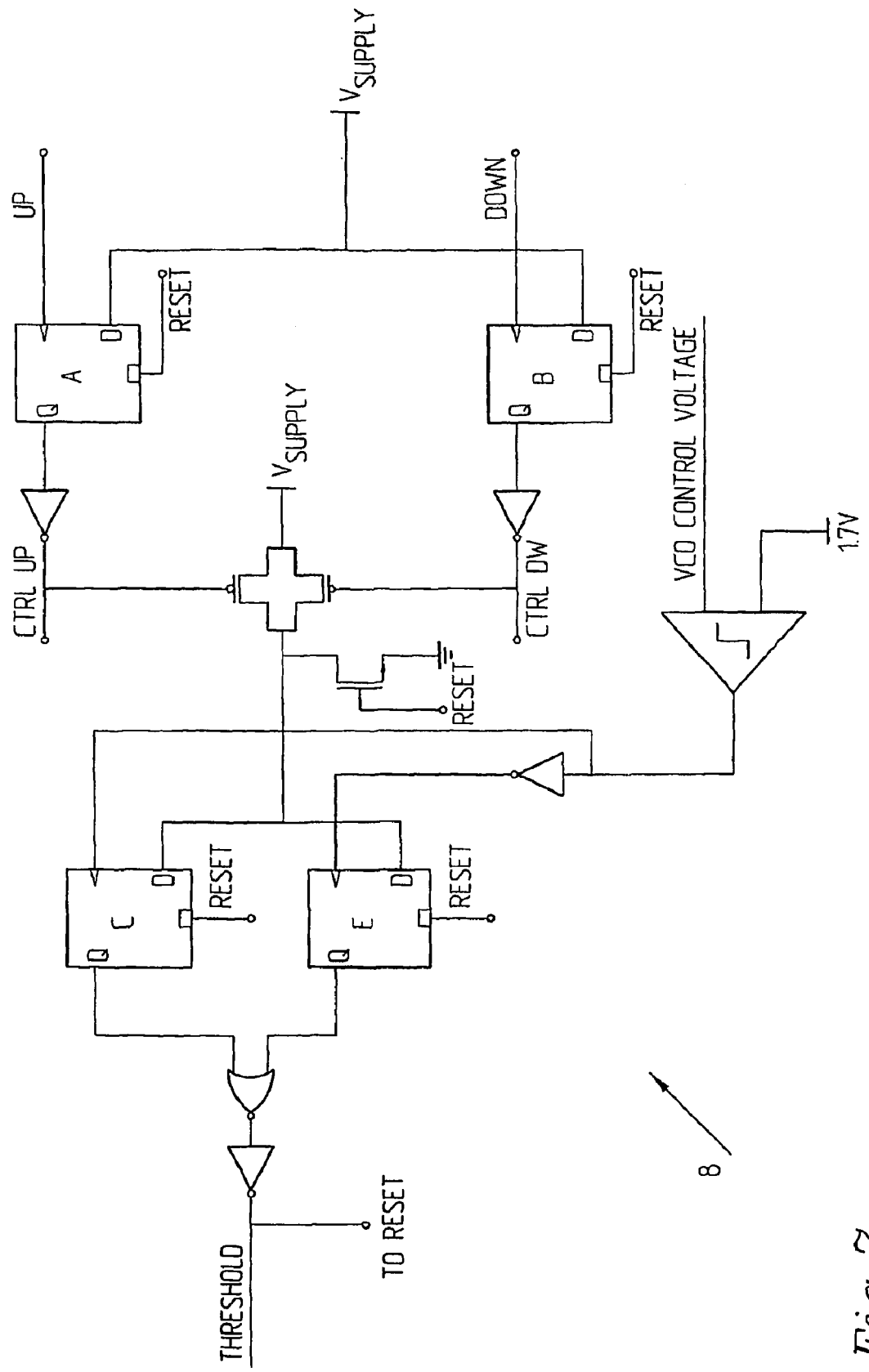
FIG. 7 shows an example of a threshold circuit that could be used in the loop switch of FIG. 5.

A reset circuit 10 is used for resetting a counter when the circuit has been switched on. In FIG. 2 RS 10 is connected to an OR gate and alternatively RA or a signal from RS 10 may be input to MWC 4. Of course RA could be provided directly over a separate input to MWC 4 similar to RB. This just illustrates different constructional variations. Two different implementations of a loop switch arrangement will be described in FIGS. 5 and 6, whereas the threshold circuit used in FIG. 6 is illustrated in FIG. 7.

Thus, according to the invention a number of amplitude windows defined via upper and lower voltage levels are implemented and the locking procedure is initiated using a large window whereas if the control voltage settles within that window (otherwise a switch to another frequency band is necessitated), a smaller one is selected etc. depending on how many windows sizes there are used, until the signal settles within the smallest amplitude window and a lock condition has been accomplished (in the right frequency band). Then it is possible to use an arbitrary operation window, e.g. a slightly larger window or even the largest window depending on application. If on the other hand the control voltage is higher than the upper level or lower than the lower level, a switching of frequency band is performed by means of the state machine 7 outputting a digital control signal to the VCO 3, which then switches to another frequency band. It may be an adjacent band, or any band as determined by a binary search algorithm.

In the following the different components in the control circuit will be explained in a more detailed manner, starting with the multi-window circuit in FIG. 3.

According to the invention the control circuit must be able to switch the VCO between the frequency bands in order to keep the VCO control voltage in the lock state between two threshold voltages. In the particular embodiment shown it is supposed that the two threshold voltages are 1.5 V and 1.9 V. The gain of the VCO may vary between the different bands even if the voltage range remains between 1.5 V and 1.9 V.

Figure 3:
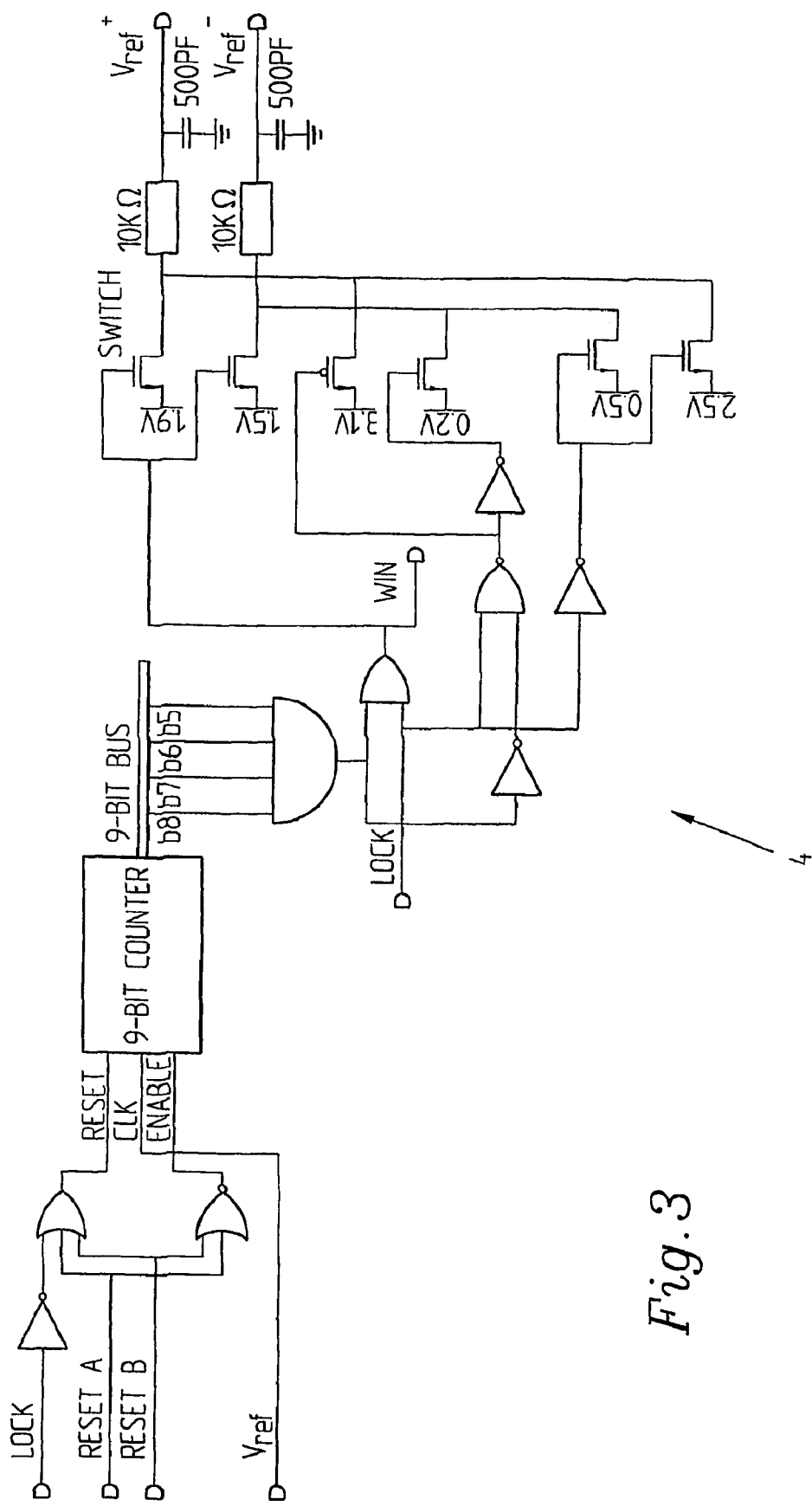
FIG. 3 is a block diagram schematically illustrated one implementation of a multi-window circuit, FIG. 4 schematically illustrates the PLL frequency synthesizer locking process using a multi-window circuit according to the present invention.

Through the implementation of the multi-window circuit 4 illustrated in FIG. 3 the problem with overshoot as previously referred to can be solved. It is here supposed that the relevant voltage thresholds are 1.5 V and 1.9 V giving a voltage difference of 400 mV. It should be clear that these figures are merely given for exemplifying reasons. However, according to the present invention as a first large amplitude window, a window, here much larger than the 400 mV, is used and after lapse of a given time period it can be established if the system more or less has settled to a steady-state value. Then a change is performed to a smaller window to verify if the steady-state value of the VCO control voltage lies between 1.5 V and 1.9 V or not. If so, the window size is changed to an operating window having e.g. a range between 0.5 V and 2.5 V, otherwise the state machine, cf. FIG. 2, must change its state until the VCO control voltage settles in the correct range.

It is supposed that the PLL works as a substantially linear system when in the small window and after each switch to different frequency band, the VCO control voltage is preferably brought to e.g. its mid-value, i.e. here 1.7 V. This is however not necessary for the functioning of the present invention but it will be described with reference to the loop switch and the threshold circuit below. If it is not known how much time that is required for the PLL to lock, the window might be reused too soon, which involves the risk that a switch of frequency bands is done even if the current frequency band was correct. An estimation of the time requested to lock needs to be done. This can be done in any appropriate manner.

If it is supposed that lock is achieved in the system if the difference between actual frequency and steady-state frequency is less then e.g. 0.1 Hz, than the lock-in time will be some fraction of a second, e.g. a number of milli-seconds. Therefore a delay of about that size is required before changing the amplitude of the window. A delay in the order of ms can not be provisioned with an analog network and therefore a counter is used, here a 9 bit counter. Here the reference frequency is used to clock the counter. The signal RESET A (not corresponding to RA of FIG. 2, since in FIG. 2 there is an OR-gate between RA and RESET A; this is however of no importance, since if RESET A is high, also RA is high) is here exactly the output of the NOR gate in FIG. 6 and it will be more thoroughly described below. The reference signal is the square wave of the reference signal of the PLL, whereas the LOCK signal is a signal that passes from the high logic level to the low logic level when lock is achieved. The WIN signal is an output of this circuit and it is used in the lock detection circuit to be described with reference to FIG. 9 below. This signal (WIN) is high when lock has not been achieved and the four most important bits (here) of a counter are all in the high logic level, otherwise it will be low. The VH (VREFH) signal is the upper voltage of a window (therefore it could be 1.9 V, 2.5 V or 3.1 V, while the The VL (VREFL) signal is the lower voltage of a window and it could be 1.5 V or 0.5 V or 0.2 V respectively. These voltage levels have previously been low pass filtered to reduce the amplitude of the transient produced when the system switches from one window to another.

The multiwindow circuit works as follows. It is here supposed that the PLL is still not locked meaning that the LOCK signal is in the high logic level. It is supposed that the counter starts from zero meaning that the four most significant bits (here) are low and the WIN signal has a low value. It is further, in this implementation, supposed that the frequency increases with a decreasing control voltage. It may just as well be the other way round. This means that a window [1.5; 1.9] V is switched off as well as the window [0.5; 2.5] V. The first window is thus the window [0.2; 3.1] V. At start up both RESET A and RESET B are low meaning that the ENABLE signal to the counter is high while the RESET signal is low. Thus the counter will start counting. The VCO control voltage may now either fall below 0.2 V or the four most significant bits of the counter go high. If it is supposed that the VCO control voltage falls below 0.2 V, then a RESET signal will pass from the low logic level to the high logic level. Which depends on the specific implementation. The ENABLE signal goes down while the RESET goes high. It is exceedingly important to reset the counter, otherwise, in the next step it will count for a shorter time period meaning that the system could change the window too early. That might bring the system changing the state of the state machine if the current state is the correct one.

The reset of the counter has to be a bit delayed. Therefore it must be an asynchronous reset which is delayed by some $10^{ths}$ of nanoseconds. When the four most significant bits of the counter are high, the WIN signal goes high while the previous window is switched off. This means that the new, smaller window is [1.5; 1.9] V. The delay of some $10^{ths}$ of nanoseconds is needed to reset a counter since the comparators, cf. FIG. 2, need some time to perform a full transition from the low logic level to the high logic level. As soon as the counter is reset, the active window will again be [0.2; 3.1] V whereas the window [1.5; 1.9] V is switched off.

If there is an UP signal, then the RESET A signal will remain high until VCO control voltage reaches, here ideally 1.7 V. This means that during the time required for the VCO control voltage to reach the mid-value (1.7 V), the counter will be reset. After RESET A goes down, the counter will start counting again.

It is now supposed that the VCO control voltage does not fall below 0.2 V but the counter finishes to count. The four most significant bits go high and the window is changed as before from [0.2; 3.1] V to [1.5; 1.9] V. The VCO control voltage may then either lie within this window or it may fall outside this window. If the VCO control voltage is outside the latter window then there will be an UP or DOWN signal and the system will develop as before, otherwise the system is locked. The LOCK signal will therefore go low switching off both the previous windows. The window will now be [0.5; 2.5] V, i.e. the so called operating window. Moreover the LOCK signal will force the RESET signal to the high logic level and therefore the counter will stop counting.

If for some reason the VCO control voltage exceeds 2.5 V or falls below 0.5 V, then the LOCK signal will go high again and the system will restart the locking procedure.

Figure 4:
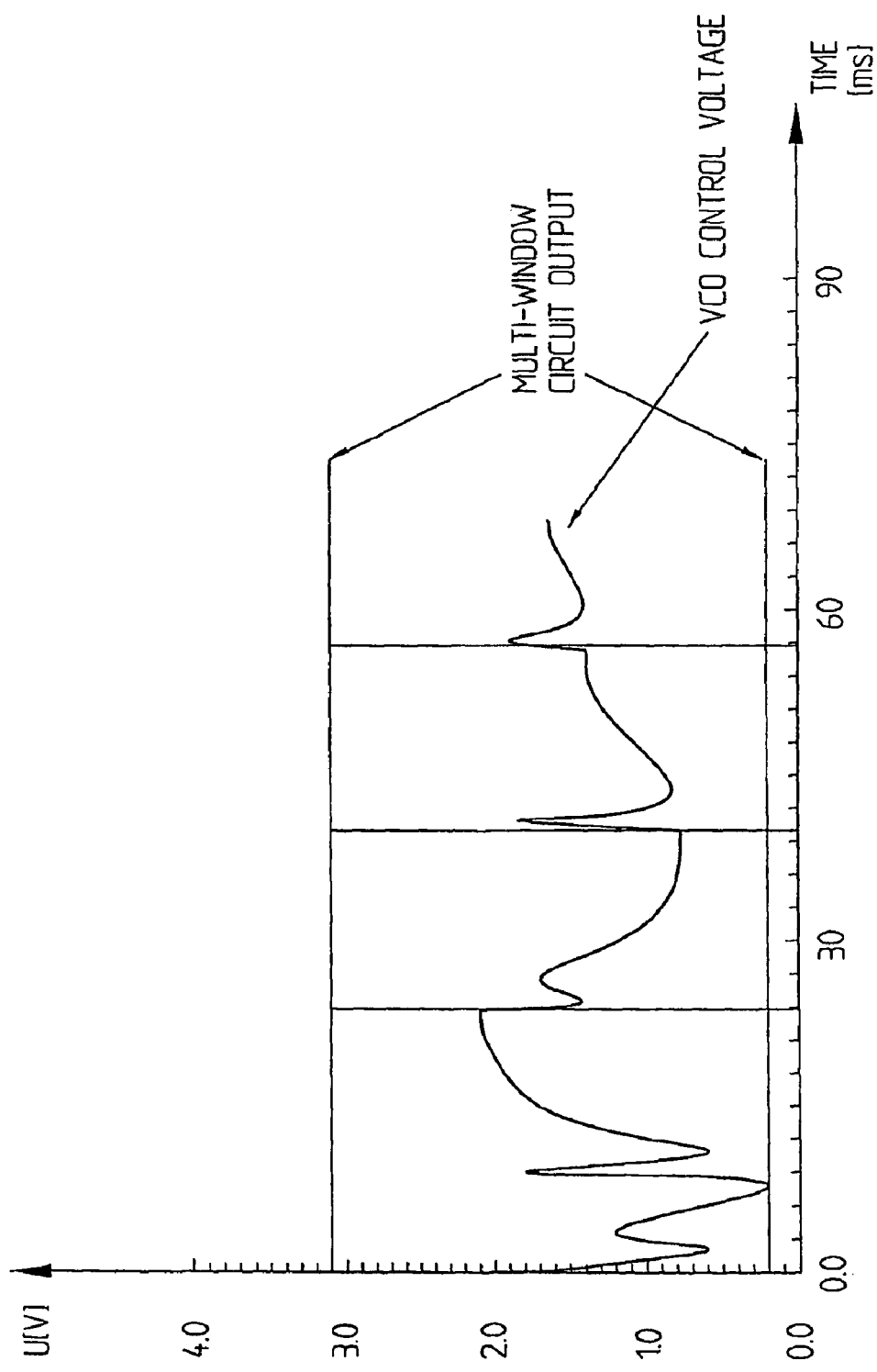

In FIG. 4 it is illustrated how the multi-window circuit 4 operates. The locking process is illustrated. The window is narrowed three times to check whether the VCO control voltage is between 1.5 V and 1.9 V. The first UP to the state machine is produced because the VCO control voltage falls below 0.2 V. Therefore the counter is reset and the VCO control voltage is brought between 1.5 V and 1.9 V to continue the locking process. In this exemplifying simulated illustration it is supposed that a time interval of about 16 ms is used which in this system is too short, but it should still explain the operational principle of the multi-window circuit. In this case the window is changed three times during the locking process and the smallest amplitude window: [1.5; 1.9] V is used. In an advantageous implementation a loop switch is used to bring the VCO control voltage to the desired voltage level which in this particular case is the mid-level voltage, here 1.7 V, and to ensure stability of the circuit.

One example of a loop switch is illustrated in FIG. 5. The loop switch circuit is used to charge or discharge the VCO control voltage e.g. in the active loop filter, cf. FIG. 8, until the VCO control voltage returns to (in this embodiment) substantially the mid-level voltage. As soon as the VCO control voltage reaches substantially 1.7 V, the loop switch circuit may stop to charge or discharge the control point CP. The threshold circuit 8, which will be more thoroughly described in FIG. 7, controls the two switches made with the N-MOS and P-MOS transistors 9A, 9B. As referred to above the threshold circuit 8 receives UP and DOWN inputs from the comparators. If there is an UP, this means that the VCO control voltage has passed the low threshold (VL also denoted VREFL), meaning that the CTRL UP will be low closing the switch made with the P-MOS 9B since the output of the OR gate will pass from a high logic level (the threshold signal THR is zero at the beginning while CTRL UP is in the high logic level) to zero logic level. Therefore the power supply will start to recharge the control point CP. As soon as the VCO control voltage has reached the mid-level voltage, the threshold signal THR will be asserted and this will reset the CTRL UP/DW depending on implementation and the THR stopping the recharging process. Here it has been supposed that an increasing control voltage decreases the frequency. This may of course be the other way round.

If on the other hand a DOWN signal was received, this means that the CTRL DW would go to the low logic level and the output of the OR gate would pass from the low logic level to the high logic level. Therefore, because a DOWN (CTRL DW) signal was asserted, this means that the VCO control voltage passed the high threshold voltage (VH also denoted VREFH) and the circuit will start to discharge the control point CP until the VCO control voltage reaches, here, the mid-level voltage. At this point the THR signal will be asserted and the CTRL DW signal and the threshold THR will be reset thus stopping the discharging process.

One example of a threshold circuit 8 that could be used in the loop switch of FIG. 5 is schematically illustrated in FIG. 7. The threshold circuit 8 has to detect when the VCO control voltage passes the 1.7 V level and must then reset the CTRL UP or the CTRL DW signals and the threshold signal THR. This is done by changing the THR signal from the low logic level to the high logic level. It can be seen that as soon as one of the UP or DW signals goes high, a high logic level is loaded by flip-flop A or flip-flop B setting the CTRL UP or CTRL DW to a low logic level. This means that one of the two P-MOS switches connected to $V_{supply}$ opens setting the D input of the flip-flop C and E to the high logic level. At this stage nothing can change until the VCO control voltage reaches 1.7 V. If the voltage was higher than 1.7 V, then there will be a negative transition and the flip-flop E will be clocked, and if the VCO control voltage was lower than 1.7 V, the flip-flop C will be clocked. In both cases a high logic level will be loaded by one of the two flip-flops setting the THR signal to a high logic level. This will reset all the flip-flops and therefore the signals CTRL UP and CTRL DW will return to the high logic level. Moreover an N-transistor will return the D input of the flip-flops C and E to the low logic level discharging this node to ground. This is necessary in order to avoid that the THR signal is asserted more than once. This will stop the recharging or discharging of the control point CP.

Figure 8:
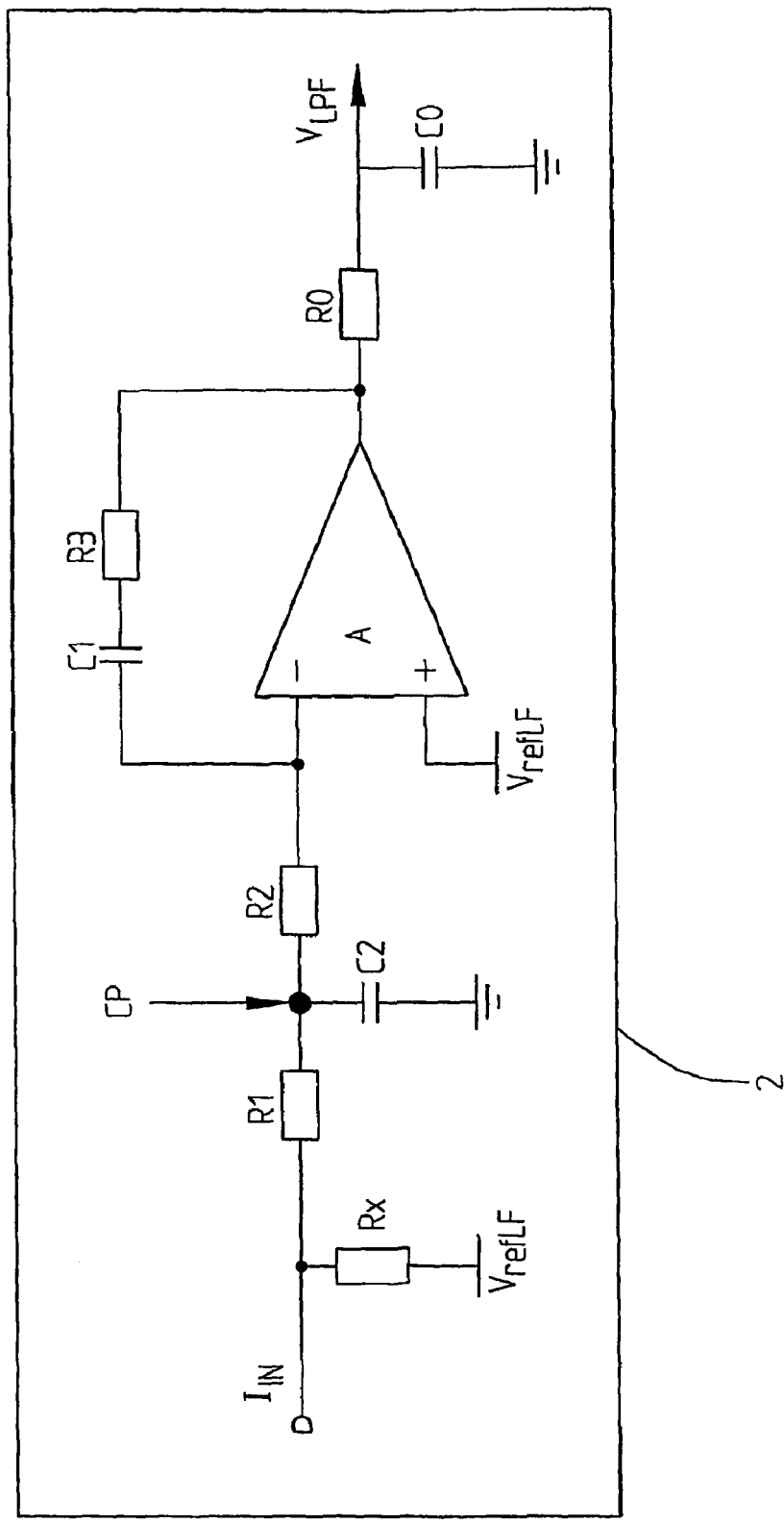
FIG. 8 illustrates one example of an active loop filter used according to one implementation of the invention.

FIG. 8 schematically illustrates a block diagram of, here, an external active loop filter 2 that with advantage is used. Of course this is merely one particular example, the main thing in this implementation being that it is an active filter. (In an alternative implementation the arrangement comprises a phase frequency detector and a charge pump. The charge pump then comprises the loop filter means, or functionality, in that case a passive filter.) It has been realized that the output of the low pass filter can not act as a control point, or in any case it is not advantageous, since the filter is active and the loop has a narrow bandwidth. Therefore according to the invention, the control point should be located before the amplifier A of the filter 2. The voltage at the output of the operational amplifier A depends also on the voltage across the capacitor C2. The changing rate in this voltage is very small due to the narrow bandwidth (<50 Hz), and therefore, even if it is possible to force the output of the filter to 1.7 V, the operational amplifier A will have time to return the output of the loop filter to substantially the previous value. This may produce a self-oscillation in the circuit, therefore the PLL will not be able to lock. If the current is decreased to a lower value in order to increase the time required to bring the VCO control voltage to the mid-level, this generally will not function since then the circuit will not be able to bring the VCO control voltage to 1.7 V since the current needs to be decreased too much. Therefore, if it is desirable to force the output of the loop filter 2 to return to the mid-level after each switching, it has been realized that the voltage that advantageously is to be modified, is the voltage across the capacitor C2. This requires one more circuit outputs. Since the filter is realized with an inverting configuration, in this case, the loop switch of FIG. 5 needs to be slightly modified. When the output voltage increases, this means that the voltage across the capacitor C2 decreases. Therefore it is appropriate to modify the circuit of FIG. 5 into a circuit as disclosed in FIG. 6, wherein the position of the CTRL UP and the CTRL DW signals are exchanged. The CTRL UP signal will enter the NOR gate whereas the CTRL DW will enter the OR gate. The loop switch of FIG. 6 is used to charge/discharge the control point (CP) in the active loop filter until the VCO control voltage returns to the desired value, e.g. the mid-level voltage. In other aspects the loop switches of FIGS. 5 and 6 are similar. It should be clear that of course the loop filter does not have to be exactly as in FIG. 8, this is merely illustrated as one advantageous embodiment and in principle various kinds of loop switches are possible, two examples of which being illustrated in FIGS. 5 and 6. Also the control point CP (relevant particularly for the loop switch of FIG. 6) could be another than the one specifically indicated in FIG. 8, the main thing being that it is located before the operational amplifier A, particularly in embodiments in which an active loop filter is used.

If the DW signal is asserted, this means that the VCO control voltage has exceeded the VREFH (VH). The system must then discharge the output of the LP filter 2 and therefore the CTRL DW signal will change from high to low logic level and the output of the OR gate will follow the same transition. This means that the P-MOS switch will be on and the P-MOS branch will start to increase the voltage across the capacitor C2. Therefore the VCO control voltage will start to decrease towards the mid-level voltage, in this case 1.7 V. If the UP signal is asserted, this means that the VCO control signal has fallen below VREFL (VL) and the system must charge the output of LP 2. The procedure is analogue to the case when the DW signal is asserted. The output of the NOR gate will change the low to high logic level, switching on the N-MOS. Therefore the N-MOS branch will start to decrease the voltage across C2. The VCO control voltage will then increase towards the mid-level voltage.

The sizes of the transistor switches have to be selected such as to ensure that the VCO control voltages are not pulled out of the right amplitude window, in this case [1.5;1.9] V. The switches should be dimensioned in an appropriate manner.

As referred to earlier in the application, the control circuit advantageously comprises a lock detection circuit 12, cf. FIG. 9. The lock detection circuit continuously monitors the lock condition of the PLL frequency synthesizer and it is able to restart the lock procedure each time the VCO control voltage exceeds an operational amplitude window.

If the VCO control voltage exceeds for example the limit voltage levels for the largest window, e.g. [0.2;3.1] V, then there will be an UP or DW signal, but no WIN signal. Then nothing changes. If however it is supposed that after the WIN signal has been asserted, there is an UP or a DW signal that goes high, then the output of the NOR gate will be low and therefore the WIN signal will sample zero value. A delay is required in the path of the WIN signal to make sure that it will sample the zero and not the one since the one is the starting value of the output of the NOR gate. The LOCK signal will therefore remain high. If both the UP and DW signals remain low, then the WIN signal will sample the one logic level and the lock will pass from the one logic level to the zero logic level. This means that the lock process has been terminated.

Figure 10:
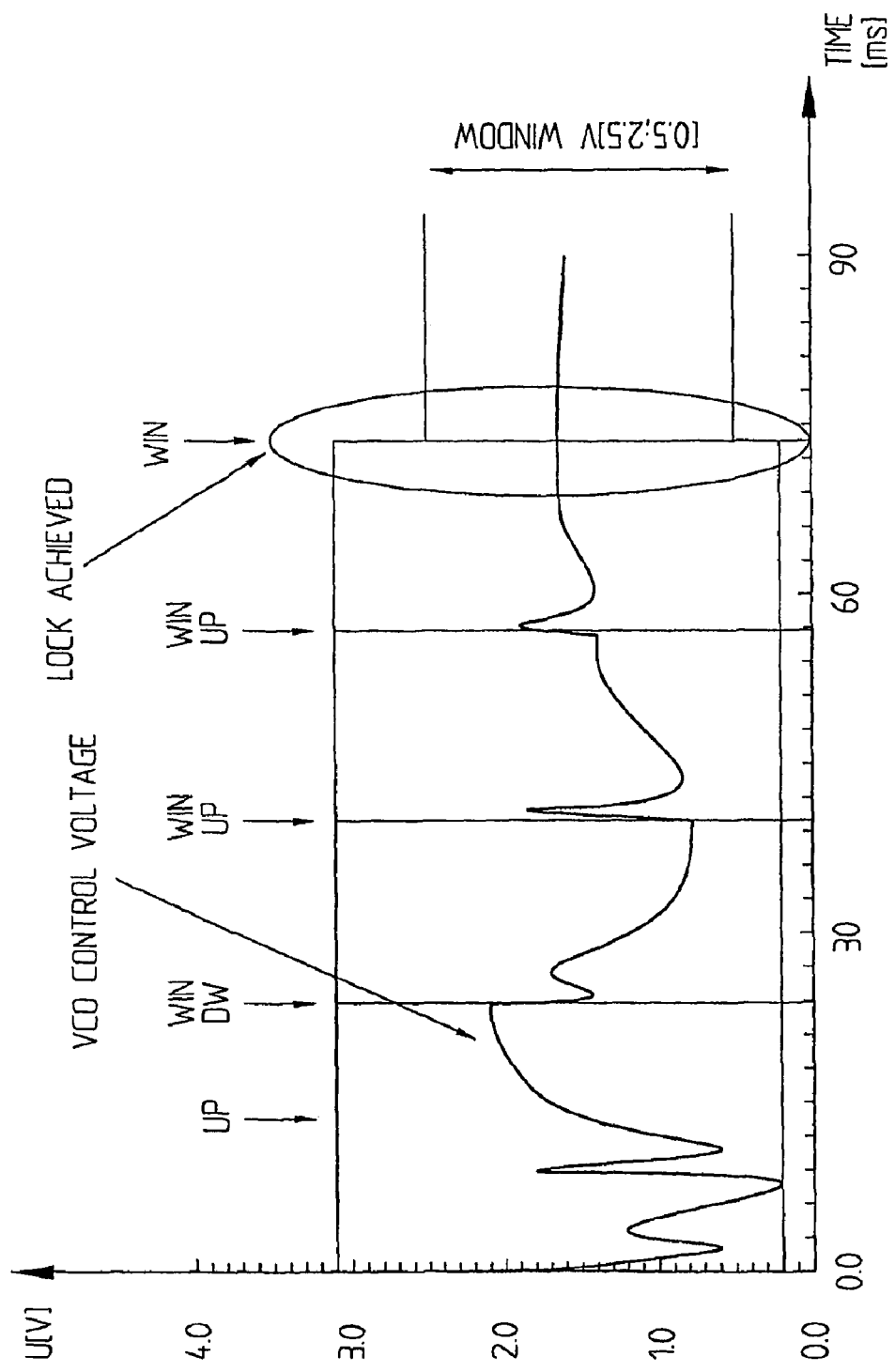
FIG. 10 illustrates the locking process as detected by the lock detection circuit of FIG. 9.

In FIG. 10 the locking process is schematically illustrated. It indicates the time at which the lock is achieved. It is here supposed that the counter counts for about 16 ms. In the figure the UP and DW signals are schematically illustrated as well as the WIN signals. When the lock signal passes from the high to the low logic level, the clock of the flip-flop B will make a positive transition. This in turn loads the output of the flip-flop B with a high logic level. Since the UP and DW signals both are low, the output of the OR gate will be zero like the output of the AND gate regardless of the high logic level of the output from the B flip-flop. If for some reason the VCO control voltage exceed the [0.5;2.5] V amplitude window, there will be an up or a down signal (when the lock has been accomplished, the active window is the so called operating window). This means that the output of the OR will go high and because of the one previously loaded by the flip-flop B, also the AND gate will go high resetting flip-flops A and B. Therefore the lock signal will go high again and the locking process will restart.

At power up of the circuit the state machine has to be initialized as well as the counter. The counter must be reset so that it can start to count from zero, whereas the state machine must be initialized to the zero state. Responsible therefore is the reset circuit RS 10, cf. FIG. 2.

Figure 11:
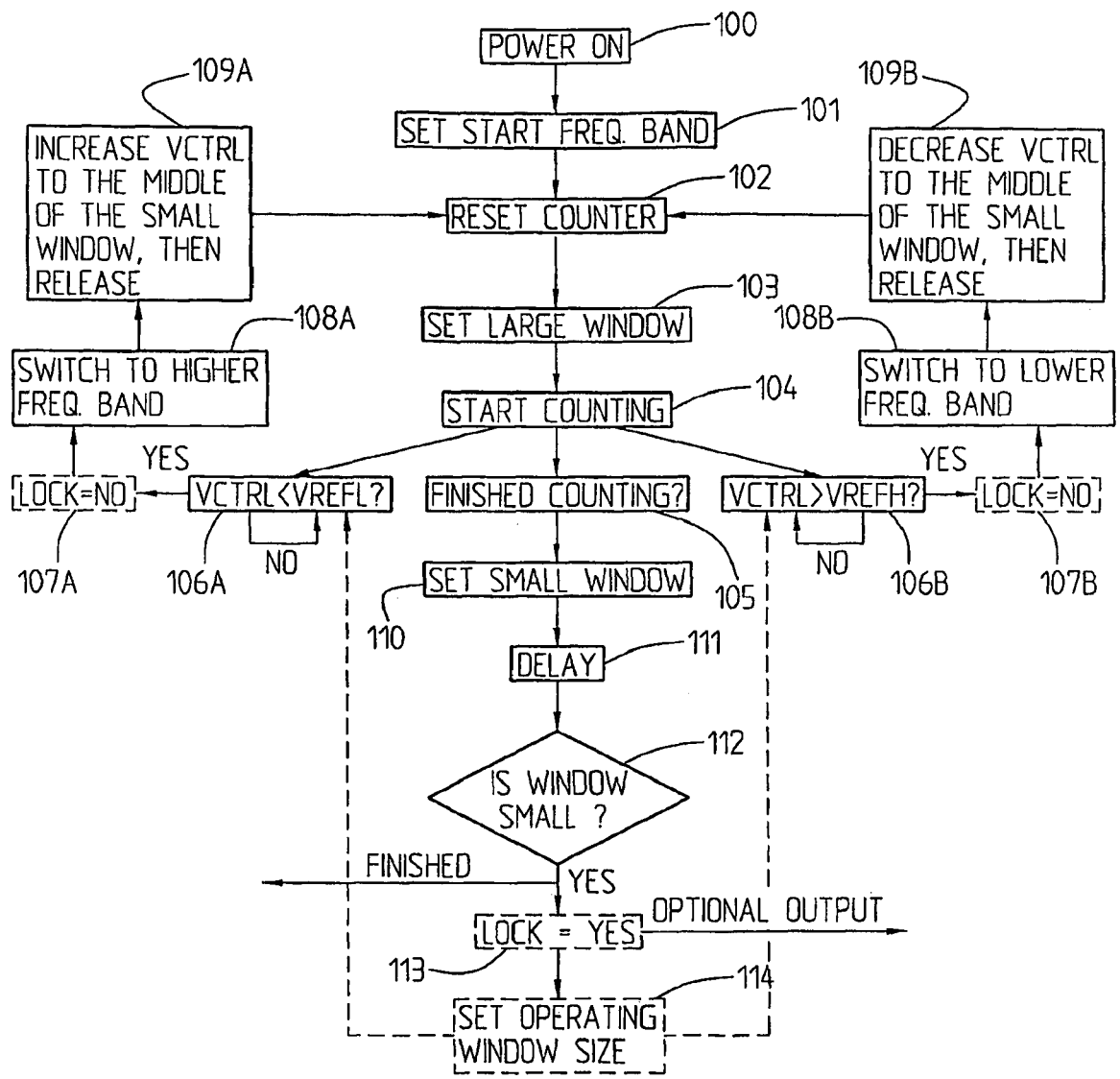
FIG. 11 is a flow diagram illustrating the operation of the arrangement according to one embodiment of the invention.

In FIG. 11 it is supposed that power is switched on, 100. Then a start frequency band is set, 101, the counter is reset as explained in the foregoing, 102. The largest amplitude window is then set in the multi-window circuit, 103 and it is established whether the voltage falls within the upper and lower voltage levels defined for said largest window, which generally is considerably broader than the relevant interval. The large window is a maximum window in which the control voltage can be allowed to move during start up, i.e. before the PLL is locked. This is typically determined by the maximum voltage that is acceptable by the VCO tuning element, a varactor. A clock is then activated and starts counting, 104. Then it is established if the VCTRL<VREFL, 106A. If not, it is continuously monitored, VCTRL is here the analog control voltage to the VCO, VREFL (VL) is the lower limit of the current window, i.e. here first the largest window. If VCTRL<VREFL, it is established that there is no lock condition so far, 107A, and a switch is performed to a higher frequency band, 108A. How this takes place was explained earlier in the application by means of a first signal to the state machine etc. Subsequently VCTRL is increased to the middle of the small window, and then released, 109A. Then the counter is reset, 102, as above. The small window is a window in which it is desirable that the control voltage be when phase lock has been achieved. This is typically centered around the middle of the acceptable tuning voltage range or around the mid-level of the frequency tuning range. It is always smaller than, or equal to, the large window, most typically substantially smaller than the large window. The minimum size of the small window is given by the requirement that the frequency bands match one another, i.e. that there are no desired frequencies that can not be reached or synthesized when VCTRL is restricted to the small window. In the normal case the bands have some overlap.

It is also correspondingly examined if VCTRL is>VREFH (VH), 106B. If not, it is monitored, and if yes, it is established that there is no lock, 107B. Then a switch to a lower frequency band is performed, 108B, and VCTRL is decreased to the middle of the small window, and then released, 109B, whereupon the counter is reset, 102, as explained above. If however the clock finishes counting, 105, this means that the voltage falls within the given amplitude values of the window, and then the small or a smaller window is set, 110. A delay is introduced, 111, then it is examined if the window is small, 112. If yes, it is detected (indicated) that there is a lock condition, 113 which may result in an optional output indication to that effect. Then may optionally an operating window size be set, 114. Step 113 above supposes that there is a lock detection circuit provided, this is however not necessary. If not, the procedure is simply finished after detection that the window is small. By operating window size is here meant a window in which the control voltage is allowed to move during continuous operation, i.e. after the PLL has been locked. It is normally, but not necessarily, larger than or equal to the small window and smaller than or equal to the large window. This means that optionally a somewhat larger window can be selected than the smallest window which for some applications may be desirable. Sometimes may also the smallest window be kept, whereas in other applications it may be returned to the largest window.

The counting time particularly depends on the PLL parameters of the clock frequency and it has to be carefully calculated for each loop including overshoot estimations as discussed earlier in the application.

It is here assumed that an increasing VCTRL decreases the frequency. The opposite situation can easily be adapted for by just interchanging the operations "switch to lower frequency band" and "switch to higher frequency band" (step 108A and 108B respectively). A switch to a higher or lower frequency band can be made sequentially or by means of a binary search algorithm.

The operations performed by the comparators, VCTRL<VREFL and VCTRL >VREFH are continuously in operation, also after finished counting verified and a smaller window has been set, i.e. set small window, 110 has been activated. In this manner a lock verification (lock=yes), 113, is not given if VCTRL changes out of the window VREFL<VCTRL<VREFH during the set delay time, since the "is window small", 112, is then not true.

Figure 12:
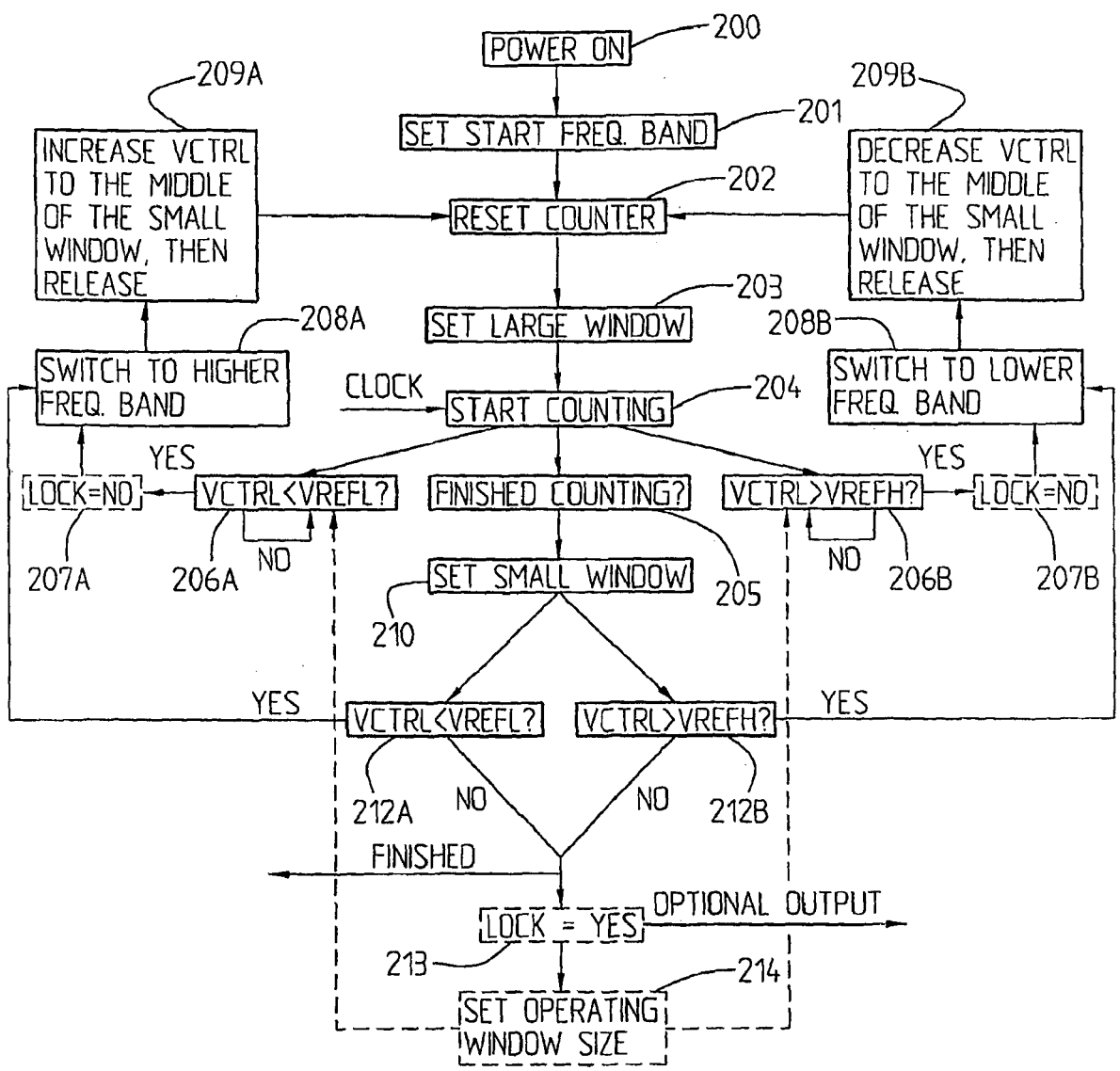
FIG. 12 is a flow diagram describing an alternative implementation of the inventive concept.

FIG. 12 is a flow diagram describing an advantageous implementation of the inventive concept. Reference signs 200-210 of FIG. 12 indicating procedural steps correspond to the steps denoted 100-110 in FIG. 11.

However, after step 110 of FIG. 11 wherein a small window is set, it is examined if VCTRL<VREFL, 212A, or if VCTRL>VREFH, 212B. If either thereof is true, a switch to a higher or a lower frequency band respectively is performed, 208A, 208B etc. If not, the procedure corresponds to that described with reference to FIG. 11, optional steps 113, 114 etc.)

(The introduction of a delay (step 111 of FIG. 11) may also be performed in this implementation in a similar manner.

The invention is not limited to use of a loop switch comprising a threshold circuit for adjusting the voltage to the mid-level voltage; the inventive concept of using a multi-window circuit is still relevant. The provision of a lock detection circuit is also not a requirement.

The inventive concept is applicable for frequency synthesizing, modulation/demodulation, clock recovery etc. Different kinds of PLLs can also be used e.g. a charge pump PLL with a phase frequency detector, or a PLL with a phase detector and an active filter etc.

It should be clear that the invention of course not is limited to the particularly illustrated embodiment, but it can be varied in a number of ways within the scope of the appended claims.

The invention claimed is:

1. A multiband Phase-Locked Loop (PLL) arrangement, comprising:
    a single-loop PLL including a phase/frequency detector, a loop filter, a Voltage-Controlled Oscillator (VCO), and a reference voltage signal ($V_{ref}$) input to the arrangement;
    a control circuit for locking the VCO to a correct frequency band, the control circuit including a multi-window circuit having at least two amplitude windows, each amplitude window being defined by respective upper and lower voltage levels; and
    a comparison device for comparing a VCO control voltage output from the loop filter with the upper and lower voltage levels of an amplitude window;
    wherein if the VCO control voltage settles within a first amplitude window, a second narrower amplitude window narrower than the first amplitude window is selected and the VCO control voltage is compared with the upper and lower voltage levels of the second amplitude window; if the VCO control voltage settles within the second amplitude window or a further subsequent even narrower amplitude window, phase lock is achieved;
    if the VCO control voltage does not settle within either the first or the second amplitude window, the comparison device provides a signal for providing a control signal to the VCO for switching the VCO to another frequency band; and for the other frequency band, the VCO control voltage signal is compared with at least one of the amplitude windows to determine if phase lock is achieved in the other frequency band.

2. The arrangement of claim 1, wherein the VCO control voltage comprises an analog signal.

3. The arrangement of claim 2, wherein the control signal comprises a digital signal.

4. The arrangement of claim 3, wherein the comparison device comprises first and second comparators for comparing the VCO control voltage with the upper voltage level and the lower voltage level, respectively, and if the VCO control voltage exceeds the upper voltage level or is below the lower voltage level, a corresponding signal is provided to a switching enabler to indicate whether a switch is to be done to a higher frequency band or to a lower frequency band.

5. The arrangement of claim 4, wherein the comparison device is connected to a first delay device such that if switching is to be done to another frequency band, the corresponding signal is clocked into the switching enabler after lapse of a time period.

6. The arrangement of claim 5, wherein the switching enabler comprises a state machine that provides the control signal to the VCO based on a clocked signal from the switching enabler.

7. The arrangement of claim 1, wherein when phase lock has been achieved, an amplitude window having an arbitrary size can be selected from the amplitude windows available in the multi-window circuit.

8. The arrangement of claim 1, wherein the control circuit comprises a lock detection circuit for continuously monitoring whether phase lock has been achieved.

9. The arrangement of claim 8, wherein the lock detection circuit comprises an initializer that restarts the control circuit with the first amplitude window if phase locking is not achieved or if phase lock is lost.

10. The arrangement of claim 9, wherein the lock detection circuit uses signals output from the comparison device and from the multi-window circuit to establish if the VCO control voltage falls within either the first or the second amplitude window, such that if the VCO control voltage does not fall within either the first or the second amplitude window, the initializer restarts the control circuit, otherwise a lock-achieved condition is indicated.

11. The arrangement of claim 4, further comprising a loop switch arrangement having a threshold circuit for adjusting the VCO control voltage to substantially assume a desired voltage within either the first or the second amplitude window after frequency band switching.

12. The arrangement of claim 11, wherein the threshold circuit controls a switching arrangement comprising two transistors for charging or discharging a VCO control voltage control point, depending on whether adjustment of the VCO control voltage upwards or downwards is needed, using a supply voltage or ground until the VCO control voltage substantially assumes a desired voltage within the amplitude window.

13. The arrangement of claim 12, wherein signals from the first and second comparators and the VCO control signal are input to the threshold circuit, and the threshold circuit uses the input signals to establish whether adjustment upwards or downwards of the VCO control signal is needed and whether no adjustment is needed.

14. The arrangement of claim 12, wherein a single supply voltage is used.

15. The arrangement of claim 1, wherein the single-loop PLL is a narrowband PLL.

16. The arrangement of claim 7, wherein upon achieving phase lock, an amplitude window larger than a smallest amplitude window within which phase lock was achieved is selected as an operation window.

17. The arrangement of claim 12, wherein the control point is located in the loop filter.

18. The arrangement of claim 17, wherein the loop filter is an active filter that includes an amplifier, and the control point is located before the amplifier.

19. The arrangement of claim 1, wherein the single-loop PLL includes a charge-pump PLL that includes a charge storage device, the VCO control voltage is based on charging and discharging of the charge storage device, and the loop filter is a passive filter.

20. A method of controlling a multiband phase-locked loop (PLL) arrangement that includes a single-loop PLL having a phase/frequency detector, a loop filter, a Voltage-Controlled Oscillator (VCO), and a reference voltage signal $V_{ref}$ input to the arrangement, the method comprising the steps of:
   (a) providing the reference voltage signal $V_{ref}$ to the single-loop PLL and to a multi-window circuit;
   (b) setting an amplitude window defined by upper and lower voltage levels in the multi-window circuit;
   (c) establishing whether an analog VCO control voltage output from the loop filter settles within the set amplitude window;
   (d) if so, setting a narrower amplitude window narrower than the set amplitude window in the multi-window circuit and establishing if the analog VCO control voltage settles within the narrower window;
   (e) if not, using a result of the comparison to establish whether to switch to a higher frequency band or to a lower frequency band;
   (f) providing a digital control signal to the VCO to switch the VCO to the higher frequency band or to the lower frequency band; and
   repeating steps (a)-(e) unless a frequency band switch is required until phase lock is achieved.

21. The method of claim 20, further comprising resetting the analog VCO control voltage when there is a switch of frequency band.

22. The method of claim 20, further comprising adjusting the analog VCO control voltage after switching frequency band such that the analog VCO control voltage assumes a desired voltage within either the set or the narrower amplitude window based on a digital threshold circuit and a transistor arrangement using a single supply voltage.

23. The method of claim 20, further comprising:
   continuously monitoring whether a phase lock condition has been achieved, and
   indicating when phase lock has been achieved in a smallest amplitude window, and
   resetting the analog VCO control voltage if the analog VCO control voltage does not settle within either the set or the narrower amplitude window.

24. The method of claim 22, further comprising providing a signal from the transistor arrangement to a control point in the loop filter.

25. The method of claim 24, wherein the loop filter is an active filter.

26. The method of claim 25, wherein the control point is located before an amplifier in the loop filter.

27. The method of claim 20, wherein the analog VCO control voltage is based on charging and discharging a charge storage device in the single-loop PLL.

* * * * *

UNITED STATES PATENT AND TRADEMARK OFFICE
CERTIFICATE OF CORRECTION

| | | |
|---|---|---|
| PATENT NO. | : 7,738,618 B2 | Page 1 of 1 |
| APPLICATION NO. | : 10/595426 | |
| DATED | : June 15, 2010 | |
| INVENTOR(S) | : Jacobsson et al. | |

It is certified that error appears in the above-identified patent and that said Letters Patent is hereby corrected as shown below:

In Column 1, Line 64, delete "cone" and insert -- done --, therefor.

In Column 4, Line 61, delete "amplitude," and insert -- amplitude --, therefor.

In Column 10, Line 59, after "while the" delete "The".

In Column 16, Line 4, delete "etc.)" and insert -- etc. --, therefor.

In Column 16, Line 5, delete "(The" and insert -- The --, therefor.

Signed and Sealed this

Nineteenth Day of October, 2010

David J. Kappos
*Director of the United States Patent and Trademark Office*